United States Patent
Bettagere Krishnamurthy

(10) Patent No.: US 11,641,268 B2
(45) Date of Patent: May 2, 2023

(54) ASYNCHRONOUS CHIP-TO-CHIP COMMUNICATION

(71) Applicant: Synopsys, Inc., Mountain View, CA (US)

(72) Inventor: Pramod Bettagere Krishnamurthy, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/570,145

(22) Filed: Jan. 6, 2022

(65) Prior Publication Data

US 2022/0231830 A1 Jul. 21, 2022

Related U.S. Application Data

(60) Provisional application No. 63/139,144, filed on Jan. 19, 2021.

(51) Int. Cl.
*H04L 25/38* (2006.01)
*H04L 7/06* (2006.01)
*H03M 7/40* (2006.01)

(52) U.S. Cl.
CPC ............. *H04L 7/06* (2013.01); *H03M 7/40* (2013.01)

(58) Field of Classification Search
CPC .......... H04L 7/06; H04L 7/0331; H03M 7/40; H04B 1/70718; G06F 3/03545; H03K 19/0966; G06E 1/02

USPC ................. 375/370, 369, 343, 340
See application file for complete search history.

(56) References Cited

U.S. PATENT DOCUMENTS

| | | | | |
|---|---|---|---|---|
| 4,542,517 A * | 9/1985 | Goss | ..................... | H04L 7/0331 375/292 |
| 4,651,329 A * | 3/1987 | Goss | ..................... | H04L 7/0331 327/20 |
| 5,048,052 A * | 9/1991 | Hamatsu | ............ | H04B 1/70718 380/46 |
| 5,247,138 A * | 9/1993 | Landmeier | .......... | G06F 3/03545 178/19.01 |
| 5,548,531 A * | 8/1996 | Shabeer | .................... | G06E 1/02 398/166 |
| 2011/0298495 A1 * | 12/2011 | Nijssen | .............. | H03K 19/0966 326/93 |

* cited by examiner

*Primary Examiner* — Phuong Phu
(74) *Attorney, Agent, or Firm* — Patterson + Sheridan, LLP

(57) ABSTRACT

Systems and methods for asynchronous communication are disclosed. For example, a method for asynchronous communication includes encoding, by a transmitter circuit and according to a first clock signal, a bit sequence by converting a one-bit in the bit sequence into a first sequence and a zero-bit in the bit sequence into a second sequence. A length of the first sequence and a length of the second sequence differ by at least three bits. The method also includes communicating, by the transmitter circuit, the first sequence and the second sequence to a receiver circuit that decodes the first sequence and the second sequence according to a second clock signal that is independent of the first clock signal.

20 Claims, 5 Drawing Sheets

ASYNCHRONOUS CHIP-TO-CHIP COMMUNICATION

CROSS-REFERENCE TO RELATED APPLICATIONS

This application claims priority to and the benefit of U.S. Provisional Patent Application Ser. No. 63/139,144, entitled "Asynchronous Chip-to-Chip Communication," filed Jan. 19, 2021, which is incorporated herein by reference in its entirety.

TECHNICAL FIELD

The present disclosure relates to chip-to-chip communication.

BACKGROUND

Chip-to-chip asynchronous communication is used to transfer low bitrate data, typically to perform configuration settings of modules. Asynchronous communication is typically achieved using independent clocks for the transmission and the reception. Stated differently, the transmit chip may use a transmit clock that is independent of a receive clock used by the receive chip.

SUMMARY

According to an embodiment, a method for asynchronous communication includes encoding, by a transmitter circuit and according to a first clock signal, a bit sequence by converting a one-bit in the bit sequence into a first sequence and a zero-bit in the bit sequence into a second sequence. A length of the first sequence and a length of the second sequence differ by at least three bits. The method also includes communicating, by the transmitter circuit, the first sequence and the second sequence to a receiver circuit that decodes the first sequence and the second sequence according to a second clock signal that is independent of the first clock signal.

Encoding the bit sequence may include adding a synchronization sequence before converting the one-bit or the zero-bit. A length of the synchronization sequence differs from the length of the first sequence and the length of the second sequence by at least three bits.

In some embodiments, the method also includes serializing, by the transmitter circuit and according to the first clock signal, the encoded bit sequence.

In certain embodiments, the method further includes de-serializing, by the receiver circuit and according to the second clock signal, the encoded bit sequence.

In particular embodiments, the method also includes storing the encoded bit sequence in a plurality of flops in the receiver circuit.

Decoding the first sequence may include matching the first sequence to one of three sequences.

The first sequence and the second sequence may begin with at least two matching bits.

The first sequence may include a first segment of matching bits followed by a second segment of matching bits that are opposite the matching bits of the first segment its.

According to another embodiment, a system for asynchronous communication includes a transmitter circuit and a receiver circuit. The transmitter circuit encodes, according to a first clock signal, a bit sequence by converting a one-bit in the bit sequence into a first sequence and a zero-bit in the bit sequence into a second sequence. A length of the first sequence and a length of the second sequence differ based on a difference between a frequency of the first clock signal and a frequency of the second clock signal. The receiver circuit receives, from the transmitter circuit, the first sequence and the second sequence and decodes the first sequence and the second sequence according to a second clock signal that is independent of the first clock signal.

Encoding the bit sequence may include adding a synchronization sequence before converting the one-bit or the zero-bit. A length of the synchronization sequence may differ from the length of the first sequence and the length of the second sequence by at least three bits.

The transmitter circuit may serialize, according to the first clock signal, the encoded bit sequence.

The receiver circuit may de-serialize, according to the second clock signal, the encoded bit sequence.

The receiver circuit may store the encoded bit sequence in a plurality of flops.

Decoding the first sequence may include matching the first sequence to one of three sequences.

The first sequence and the second sequence may begin with at least two matching bits.

The first sequence may include a first segment of matching bits followed by a second segment of matching bits that are opposite the matching bits of the first segment.

According to another embodiment, a non-transitory computer readable media stores instructions for asynchronous communication that, when executed by a processor, cause the processor to implement a transmitter circuit that encodes, according to a first clock signal, a bit sequence by converting a one-bit in the bit sequence into a first sequence and a zero-bit in the bit sequence into a second sequence. A length of the first sequence and a length of the second sequence differ by at least three bits. The processor also implements a receiver circuit that receives the first sequence and the second sequence from the transmitter circuit and decodes the first sequence and the second sequence according to a second clock signal that is independent of the first clock signal.

Encoding the bit sequence may include adding a synchronization sequence before converting the one-bit or the zero-bit. A length of the synchronization sequence may differ from the length of the first sequence and the length of the second sequence by at least three bits.

The transmitter circuit may serialize, according to the first clock signal, the encoded bit sequence.

The receiver circuit may de-serialize, according to the second clock signal, the encoded bit sequence.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Chip-to-chip asynchronous communication is used to transfer low bitrate data, typically to perform configuration settings of modules. Asynchronous communication, however, may introduce several issues. For example, clock frequency and synchronicity requirements for receiver and transmitter designs may make system design complex. As another example, transmitter and receiver design complexity depends on the interface protocol and handling of asynchronous crossings. As yet another example, bit transmission reliability depends on the physical connection between transmitter and receiver, which may result in restrictions being imposed on board design to ensure reliability.

Aspects of the present disclosure relate to asynchronous chip-to-chip communication. Specifically, this disclosure describes a system that implements a communication protocol that allows communication between chips that use independent clock signals. According to the protocol, the chips encode bit sequences by converting the bits into sequences of different lengths. For example, a one-bit may be converted into a sequence of a first length and a zero-bit may be converted into a sequence of a second length. The difference between the first and second lengths may be based on a difference in frequencies of the asynchronous clocks. As a result, the difference between the first and second lengths may be large enough to account for errors introduced by the asynchronous clocks. For example, the first and second lengths may differ by at least three bits.

In this manner, the clocks used for the transmitter and the receiver can be asynchronous. Moreover, the asynchronous crossings at the receiver become a predictable member of a finite set of symbols. Thus, a simple multi-flop synchronizer can handle the asynchronous crossings, which simplifies the receiver design in certain embodiments. Furthermore, because the bit transmission reliability is independent of the physical medium characteristics, the transmitter and receiver may not need to be calibrated. Additionally, because there is no clock-data relationship that needs to be maintained during transmission, there are no restrictions on the trace design on the board, thus simplifying board design, in certain embodiments.

Figure 1:
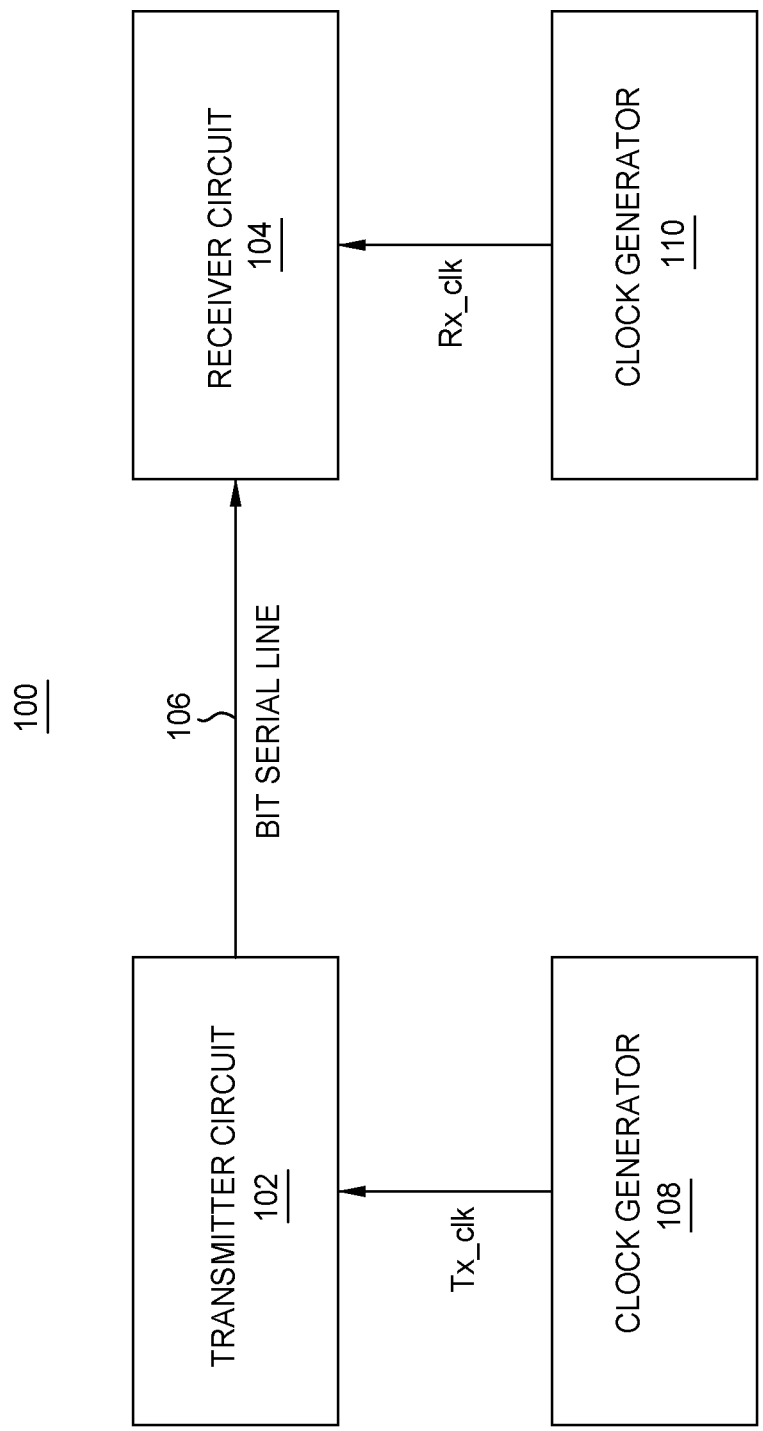
FIG. 1 illustrates an example system.

FIG. 1 illustrates an example system 100. As seen in FIG. 1, the system 100 includes a transmitter circuit 102 and a receiver circuit 104. The transmitter circuit 102 and the receiver circuit 104 may be implemented in different chips. These chips may be embodied in the different components of a system (e.g., the computer system 500 of FIG. 5), or a computer system (e.g., the computer system 500 of FIG. 5) may execute software that implements the functionality of these chips.

The transmitter circuit 102 communicates data to the receiver circuit 104 over a bit serial line 106. The transmitter circuit 102 and the receiver circuit 104 operate according to independent clock signals. A clock generator 108 produces a clock signal (Tx_clk) for the transmitter circuit 102. A clock generator 110 produces a clock signal (Rx_clk) for the receiver circuit 104. Tx_clk is independent or asynchronous of Rx_clk. Tx_clk and Rx_clk may have similar frequencies in certain embodiments. For example, Tx_clk and Rx_clk may have frequencies that differ by 10% without disrupting the communication between the transmitter circuit 102 and the receiver circuit 104.

The transmitter circuit 102 and the receiver circuit 104 use a communication protocol that allows the transmitter circuit 102 and the receiver circuit 104 to communicate with each other using independent clocks. In this protocol, the transmitter circuit 102 encodes a bit sequence using the Tx_clk by converting zero-bits and one-bits in the bit sequence into sequences of different lengths. The difference in lengths may depend on the difference in frequencies of the independent clocks. The larger the difference between the frequencies of the clocks, the larger the difference in lengths of the sequences for zero-bits and one-bits. For example, the transmitter circuit 102 may convert each zero-bit into a 7-bit sequence (e.g., 0011111) and each one-bit into a 10-bit sequence (e.g., 0011111111). The difference in the lengths of the two different bit sequences (e.g., three or more bits) may be sufficiently large to account for errors introduced by Tx_clk and Rx_clk. In some embodiments, the transmitter circuit 102 also adds a starter bit sequence, which may be referred to as a SYNC sequence or SYNC field, at the beginning of the encoded bit sequence. In this manner, the transmitter circuit converts a bit sequence of zero-bits and one-bits into an encoded sequence that begins with a starter bit sequence followed by different length bit sequences representing the zero-bits and the one-bits. Additionally, the different length bit sequences may each include a first sequence of matching bits followed by a second sequence of opposite bits. For example, the first sequence may include at least two matching bits (e.g., at least two zeroes or two ones) and the second sequence may include a sequence of matching bits that are opposite from the bits in the first sequence. If the first sequence is a sequence of zeroes, then the second sequence is a sequence of ones. If the first sequence is a sequence of ones, then the second sequence is a sequence of zeroes.

The transmitter circuit 102 communicates the encoded sequence to the receiver circuit 104 over the bit serial line 106. For example, the transmitter circuit 102 may serialize the encoded sequence using Tx_clk and communicate the serialized stream to the receiver circuit 104 over the bit serial line 106. The receiver circuit 104 receives the encoded sequence and de-serializes the encoded sequence using Rx_clk. The receiver circuit 104 then decodes the encoded sequence using Rx_clk. For example, the receiver circuit 104 may detect the starter bit sequence and then convert the different length bit sequences following the starter bit sequence into their corresponding zero-bits and one-bits. Because the bit sequences differ in length by a sufficiently large amount, the receiver circuit 104 can correctly decode the bit sequence even if the bit sequences include errors introduced by the independent and asynchronous Tx_clk and Rx_clk. In this manner, the transmitter circuit 102 and the receiver circuit 104 communicate with each other using independent clock signals.

Figure 2:
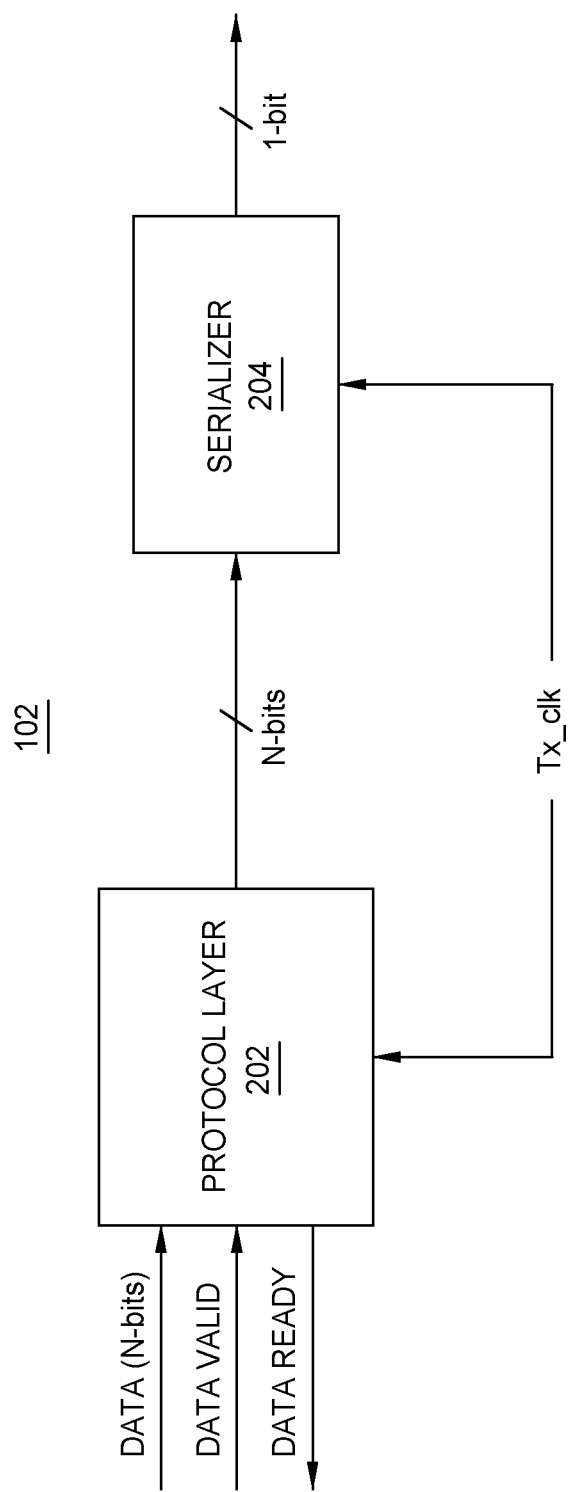
FIG. 2 illustrates an example transmitter circuit of the system of FIG. 1.

FIG. 2 illustrates an example transmitter circuit 102 of the system 100 of FIG. 1. As seen in FIG. 2, the transmitter circuit 102 includes a protocol layer 202 and a serializer 204. The protocol layer 202 converts received data into a bit sequence according to the protocol described herein. The serializer 204 serializes that bit sequence and communicates that sequence to the receiver circuit 104 (e.g., over the bit serial line 106) one bit at a time. The protocol layer 202 and the serializer 204 operate according to Tx_clk.

For example, the protocol layer 202 receives a DATA signal that includes N-bits and a DATA VALID signal indicating that the DATA signal is valid and may be encoded. The protocol layer 202 then encodes the DATA signal by converting each zero-bit into a bit sequence of a first length (e.g., 7 bits) and each one-bit into a bit sequence of a second length (e.g., 10 bits). In some embodiments, the protocol layer 202 also adds or includes a starter bit sequence to the beginning of the encoded bit sequence. After the protocol layer 202 completes encoding the bit sequence, the protocol layer 202 outputs a DATA READY signal indicating that the encoded bit sequence is ready.

The serializer 204 then serializes the encoded bit sequence and outputs the serialized bit stream. The serializer 204 may serialize the encoded bit sequence according to Tx_clk. The transmitter circuit 102 communicates the serialized bit stream to the receiver circuit 104 (shown in FIG. 1).

Figure 3:
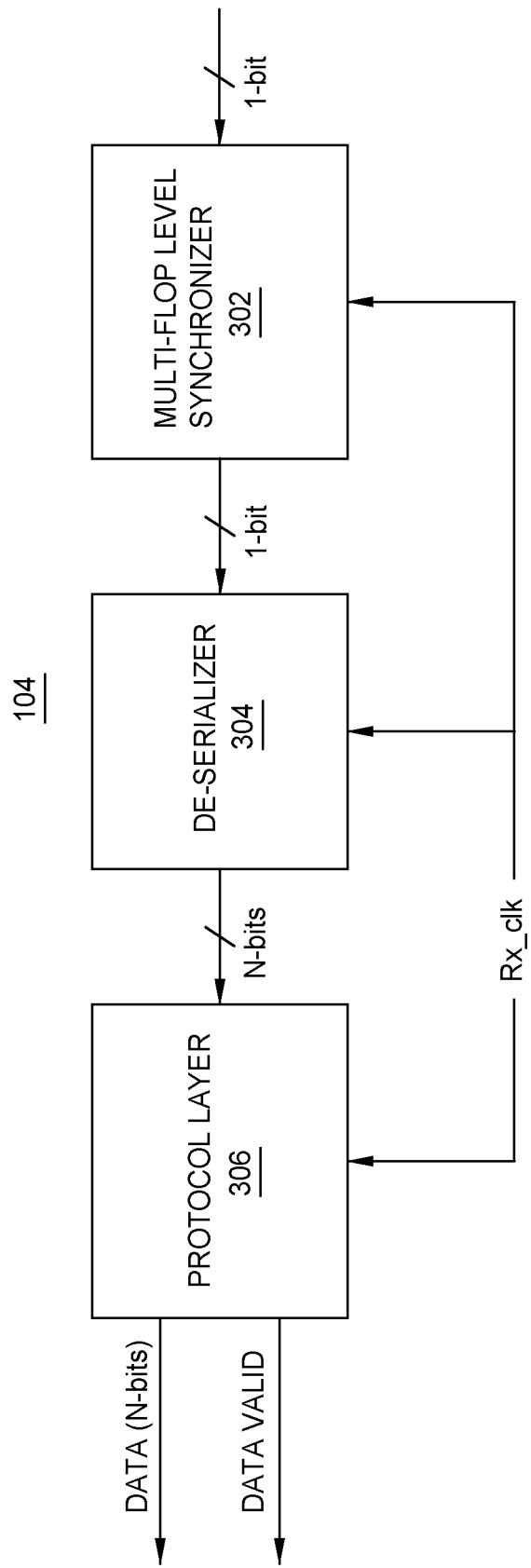
FIG. 3 illustrates an example receiver circuit of the system of FIG. 1.

FIG. 3 illustrates an example receiver circuit 104 of the system 100 of FIG. 1. As seen in FIG. 3, the receiver circuit 104 includes a multi-flop synchronizer 302, a de-serializer 304, and a protocol layer 306. The multi-flop synchronizer 302 includes circuit elements (e.g. a number of flops) that store and buffer the serialized bit sequence from the transmitter circuit 102. The number of flops may be adjusted based on the synchronicity of the Tx_clk and the Rx_clk. In certain embodiments, the multi-flop synchronizer 302 includes two or three flops. By storing and buffering the bit sequence, the multi-flop synchronizer 302 may ensure that an entire data word is received even if the asynchronous Tx_clk and Rx_clk introduce communication errors. The de-serializer 304 de-serializes the bit sequence from the multi-flop synchronizer 302 using Rx_clk. The protocol layer 306 then converts the bit sequence into data according to the protocol described herein.

For example, the protocol layer 306 may receive and decode the encoded bit sequence from the de-serializer 304 using Rx_clk by detecting and converting the different length bit sequences in the encoded bit sequence into their corresponding zero-bits and one-bits. In some embodiments, the protocol layer 306 detects the different length bit sequences by first detecting a starter bit sequence and then detecting the different length bit sequences by analyzing the bits following the starter bit sequence. After decoding the bit sequence, the protocol layer outputs the DATA signal having N-bits. The protocol layer 306 may perform error checks on the DATA signal, and if no errors are detected, the protocol layer 306 also outputs a DATA VALID signal to indicate that the DATA signal is valid.

Figure 4:
FIG. 4 illustrates an example encoded bit sequence in the system of FIG. 1.

FIG. 4 illustrates an example encoded bit sequence 400 in the system of FIG. 1 according to the communication protocol described herein. The protocol defines a packet with a SYNC field and a DATA field. The SYNC field is a prefix to the DATA field. The bit serial line 106 (shown in FIG. 1) is considered to be IDLE when the SYNC pattern is not seen and the DATA field is completed.

SYNC: This field is used to synchronize the packets at the receiver. Each data payload is preceded with a SYNC field.

DATA: This is the data payload to be sent to receiver circuit 104. The DATA field length can be fixed to any number of bits as needed by the application. The DATA field length can be dynamically modified, if a mechanism exists to indicate the length to both the transmitter circuit 102 and the receiver circuit 104 while in the IDLE state.

Each bit in the data is encoded such that the asynchronous crossings at the receiver circuit 104 can be handled. Generally, the SYNC and DATA fields are encoded using bit sequences of different lengths. The differences between the lengths of these sequences may depend on the difference between the frequencies of the asynchronous clocks Tx_clk and Rx_clk so that the differences between the lengths are large enough to accommodate communication errors caused by Tx_clk and Rx_clk. In certain embodiments, the lengths of these sequences may differ by at least three bits. The difference between the lengths of the sequences can be increased or decreased depending on the difference between the frequencies of Tx_clk and Rx_clk. For example, the greater the difference between the frequencies of Tx_clk and Rx_clk, the more communication errors may be introduced. To accommodate these errors, the sequences may have a greater difference in length.

According to an example, the SYNC sequence may be represented by a 4-bit sequence, a zero-bit may be represented by a 7-bit sequence, and a one-bit may be represented by a 10-bit sequence. The SYNC sequence may be 0011 (4-bits). The zero-bit sequence may be 0011111 (7-bits). The one-bit sequence may be 0011111111 (10-bits). Because all sequences start with 00, the receiver circuit 104 will see at least one zero-bit between sequences. Thus, the beginning of a new sequence is separated by a rising edge and therefore, pulses from two successive sequences do not merge into one pulse. Moreover, the bits of the different sequences may be flipped. For example, the SYNC sequence may be 1100 (4-bits), the zero-bit sequence may be 1100000 (7-bits), and the one-bit sequence may be 1100000000 (10-bits). Generally, each of the sequences may begin with a first sequence of matching bits (e.g., at least two zeroes or at least two ones) followed by a second sequence of matching bits that are opposite the bits in the first sequence.

The encoding of bit sequences is defined in such a way that for any sequence sent from the transmitter circuit 102, the number of possible data patterns seen at the receiver circuit 104 is limited to a number of possibilities (e.g., three possibilities). Because the encoding is like a pulse with one rising edge and one falling edge, the rising edge and the falling edge can result in metastable errors at the receiver circuit 104. If the rising edge has an error, then the pulse width is reduced by one bit. If the falling edge has an error, then the pulse width is increased by one bit. If both edges have metastable errors or both edges do not have errors, then the pulse width is unchanged.

Using the example above, the three possible patterns at the receiver circuit 104 for each sequence is given below:
SYNC sent as 0011 can be one these patterns at the receiver {0001, 00111, 0011}
Zero-bit sequence sent as 0011111 can be one these patterns at the receiver {0001111, 00111111, 0011111}
One-bit sequence sent as 0011111111 can be one these patterns at the receiver {0001111111, 00111111111, 0011111111}

Because the SYNC sequence, zero-bit sequence, and one-bit sequence do not overlap, the receiver circuit 104 can correctly determine the type of sequence by matching the received sequence with one of the nine possible sequences above. As a result, the design assures error free detection at the receiver circuit 104 in certain embodiments.

As a first example of operation, the data to be encoded at the transmitter circuit 102 may be a four-bit sequence 4'b1010 and transmitted with no error. The encoded sequence at the transmitter circuit 102 is 0011 (SYNC), 0011111111 (one-bit), 0011111 (zero-bit), 0011111111 (one-bit), 0011111 (zero-bit). The sequence received at the receiver circuit 104 is 0011 (SYNC), 0011111111 (one-bit), 0011111 (zero-bit), 0011111111 (one-bit), 0011111 (zero-bit).

As a second example of operation, the data to be encoded at the transmitter circuit 102 may be an eight-bit sequence 8'b00110000 and transmitted with error. The encoded sequence at the transmitter circuit 102 is 0011 (SYNC), 0011111 (zero-bit), 0011111 (zero-bit), 0011111111 (one-bit), 0011111111 (one-bit), 0011111 (zero-bit), 0011111 (zero-bit), 0011111 (zero-bit), 0011111 (zero-bit). Due to communication errors, the sequence received at the receiver circuit 104 may be 0011, 0011111, 0011111, 0011111111, 0011111111, 0011111, 0011111, 0011111, 0011111. The receiver circuit 104 then matches each of these sequences with one of the nine possible sequences above to determine whether the sequence represents SYNC, a zero, or a one. The receiver circuit 104 may determine based on these matches that the sequence is SYNC, zero-bit, zero-bit, one-bit, one-bit, zero-bit, zero-bit, zero-bit, zero-bit. The receiver circuit 104 may then determine that the received sequence is 8'b00110000. As seen from these examples, each of the sequences includes a segment of zero-bits followed by a segment of one-bits, and the sequences are differentiated based on length.

Figure 5:
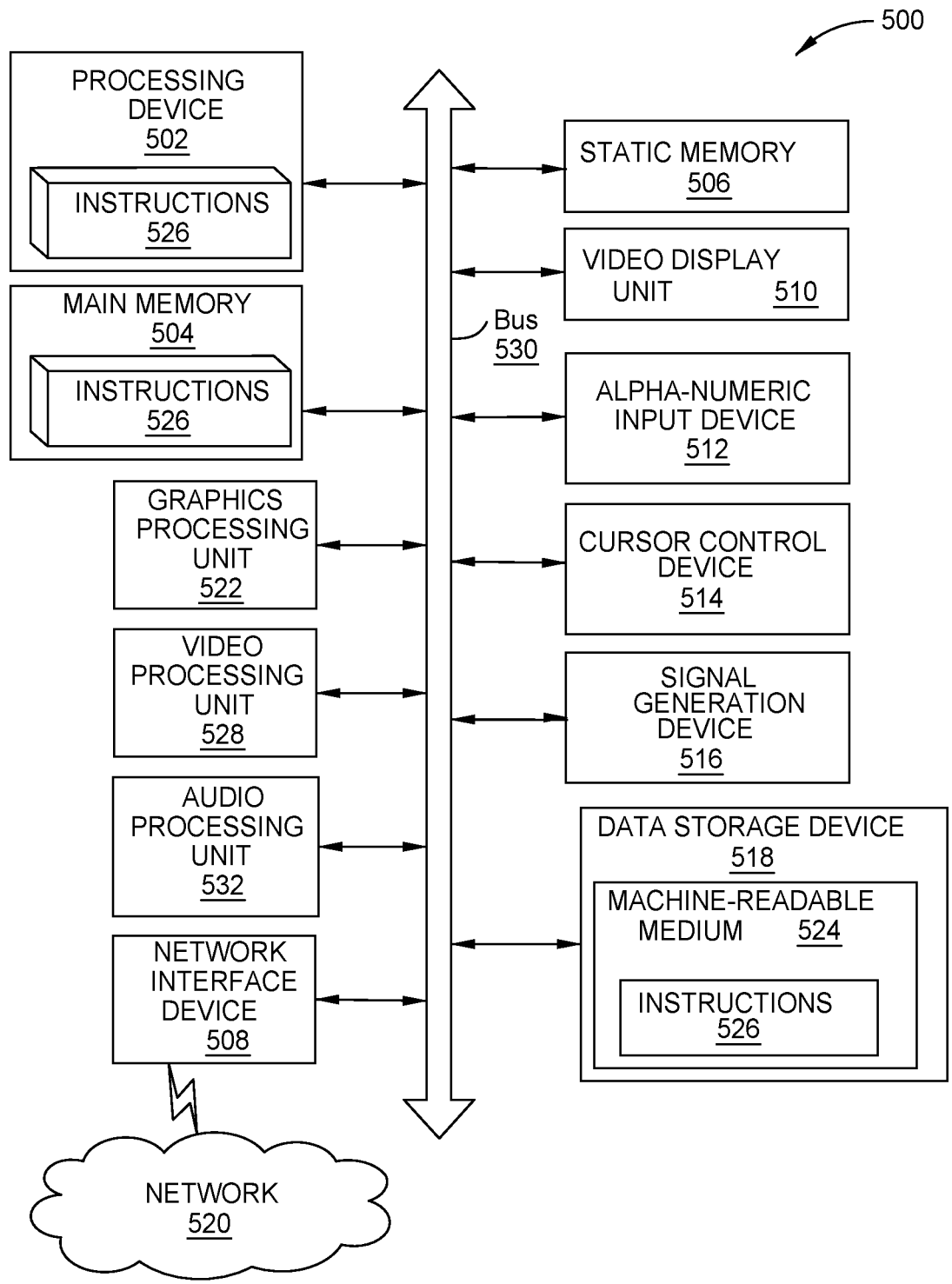
FIG. 5 depicts an abstract diagram of an example computer system in which embodiments of the present disclosure may operate.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for asynchronous communication, the method comprising:
   encoding, by a transmitter circuit and according to a first clock signal, a bit sequence by converting a one-bit in the bit sequence into a first sequence and a zero-bit in the bit sequence into a second sequence, wherein a length of the first sequence and a length of the second sequence differ by at least three bits; and
   communicating, by the transmitter circuit, the first sequence and the second sequence to a receiver circuit configured to decode the first sequence and the second sequence according to a second clock signal that is independent of the first clock signal.

2. The method of claim 1, wherein encoding the bit sequence further comprises adding a synchronization sequence before converting the one-bit or the zero-bit, wherein a length of the synchronization sequence differs from the length of the first sequence and the length of the second sequence by at least three bits.

3. The method of claim 1, further comprising serializing, by the transmitter circuit and according to the first clock signal, the encoded bit sequence.

4. The method of claim 1, further comprising de-serializing, by the receiver circuit and according to the second clock signal, the encoded bit sequence.

5. The method of claim 1, further comprising storing the encoded bit sequence in a plurality of flops in the receiver circuit.

6. The method of claim 1, wherein decoding the first sequence comprises matching the first sequence to one of three sequences.

7. The method of claim 1, wherein the first sequence and the second sequence begin with at least two matching bits.

8. The method of claim 1, wherein the first sequence comprises a first segment of matching bits followed by a second segment of matching bits that are opposite the matching bits of the first segment.

9. A system for asynchronous communication, the system comprising:
   a transmitter circuit configured to encode, according to a first clock signal, a bit sequence by converting a one-bit in the bit sequence into a first sequence and a zero-bit in the bit sequence into a second sequence, wherein a length of the first sequence and a length of the second sequence differ based on a difference between a frequency of the first clock signal and a frequency of the second clock signal; and
   a receiver circuit configured to receive, from the transmitter circuit, the first sequence and the second sequence and to decode the first sequence and the second sequence according to a second clock signal that is independent of the first clock signal.

10. The system of claim 9, wherein encoding the bit sequence further comprises adding a synchronization sequence before converting the one-bit or the zero-bit, wherein a length of the synchronization sequence differs from the length of the first sequence and the length of the second sequence by at least three bits.

11. The system of claim 9, wherein the transmitter circuit is further configured to serialize, according to the first clock signal, the encoded bit sequence.

12. The system of claim 9, wherein the receiver circuit is further configured to de-serialize, according to the second clock signal, the encoded bit sequence.

13. The system of claim 9, wherein the receiver circuit is further configured to store the encoded bit sequence in a plurality of flops.

14. The system of claim 9, wherein decoding the first sequence comprises matching the first sequence to one of three sequences.

15. The system of claim 9, wherein the first sequence and the second sequence begin with at least two matching bits.

16. The system of claim 9, wherein the first sequence comprises a first segment of matching bits followed by a second segment of matching bits that are opposite the matching bits of the first segment.

17. A non-transitory computer readable media storing instructions for asynchronous communication that, when executed by a processor, cause the processor to:
   implement a transmitter circuit that encodes, according to a first clock signal, a bit sequence by converting a one-bit in the bit sequence into a first sequence and a zero-bit in the bit sequence into a second sequence, wherein a length of the first sequence and a length of the second sequence differ by at least three bits; and
   implement a receiver circuit that receives the first sequence and the second sequence from the transmitter circuit and that decodes the first sequence and the second sequence according to a second clock signal that is independent of the first clock signal.

18. The media of claim 17, wherein encoding the bit sequence further comprises adding a synchronization sequence before converting the one-bit or the zero-bit, wherein a length of the synchronization sequence differs from the length of the first sequence and the length of the second sequence by at least three bits.

19. The media of claim 17, wherein the transmitter circuit further serializes, according to the first clock signal, the encoded bit sequence.

20. The media of claim 17, wherein the receiver circuit further de-serializes, according to the second clock signal, the encoded bit sequence.

* * * * *